(12) United States Patent
Tamura

(10) Patent No.: US 9,177,707 B2
(45) Date of Patent: Nov. 3, 2015

(54) SUPERCONDUCTING MAGNET AND METHOD FOR ADJUSTING THE SAME

(75) Inventor: Hajime Tamura, Chiyoda-ku (JP)

(73) Assignee: MITSUBISHI ELECTRIC CORPORATION, Chiyoda-Ku, Tokyo (JP)

(*) Notice: Subject to any disclaimer, the term of this patent is extended or adjusted under 35 U.S.C. 154(b) by 0 days.

(21) Appl. No.: 14/379,325

(22) PCT Filed: Apr. 20, 2012

(86) PCT No.: PCT/JP2012/060683
§ 371 (c)(1),
(2), (4) Date: Aug. 18, 2014

(87) PCT Pub. No.: WO2013/157130
PCT Pub. Date: Oct. 24, 2013

(65) Prior Publication Data
US 2015/0024941 A1 Jan. 22, 2015

(51) Int. Cl.
*H01F 6/00* (2006.01)
*H01F 41/00* (2006.01)
*H01F 6/06* (2006.01)
*H01F 29/12* (2006.01)
(Continued)

(52) U.S. Cl.
CPC .. *H01F 6/06* (2013.01); *H01F 6/00* (2013.01); *H01F 6/04* (2013.01); *H01F 7/066* (2013.01); *H01F 29/12* (2013.01); *G01R 33/3815* (2013.01)

(58) Field of Classification Search
CPC .......................................... H01F 6/00
USPC ........................................... 335/216
See application file for complete search history.

(56) References Cited

U.S. PATENT DOCUMENTS 4,560,933 A * 12/1985 Forster et al. ................ 324/319
4,571,568 A * 2/1986 Grangereau .................. 335/299
(Continued)

FOREIGN PATENT DOCUMENTS

JP 2001-60509 A 3/2001
JP 2003-220049 A 8/2003
(Continued)

OTHER PUBLICATIONS

International Search Report (PCT/ISA/210) mailed on May 22, 2012, by the Japanese Patent Office as the International Searching Authority for International Application No. PCT/JP 2012/060683.
(Continued)

*Primary Examiner* — Alexander Talpalatski
(74) *Attorney, Agent, or Firm* — Buchanan Ingersoll & Rooney PC

(57) ABSTRACT

A superconducting magnet includes a pair of superconducting coils, two heat shields surrounding the pair of superconducting coils, respectively, two vacuum chambers accommodating the two heat shields, respectively, and facing each other with a predetermined space sandwiched therebetween, a magnetic shield covering at least a portion of the two vacuum chambers, and two position adjustment mechanisms supporting the two vacuum chambers, respectively, in a position-adjustable manner. The two position adjustment mechanisms change distribution of a static magnetic field formed in the predetermined space by the pair of superconducting coils, by adjusting relative positional relation between the two vacuum chambers.

8 Claims, 4 Drawing Sheets

(51) Int. Cl.
  *H01F 6/04* (2006.01)
  *H01F 7/06* (2006.01)
  *G01R 33/3815* (2006.01)

(56) References Cited

U.S. PATENT DOCUMENTS

| | | | | |
|---|---|---|---|---|
| 4,591,790 | A * | 5/1986 | Takahashi | 324/318 |
| 4,758,812 | A | 7/1988 | Forster et al. | |
| 4,779,049 | A * | 10/1988 | Takahashi | 324/319 |
| 4,843,333 | A * | 6/1989 | Marsing et al. | 315/503 |
| 4,875,485 | A * | 10/1989 | Matsutani | 600/415 |
| 5,001,448 | A | 3/1991 | Srivastava et al. | |
| 5,083,105 | A * | 1/1992 | Herd et al. | 335/216 |
| 5,565,831 | A * | 10/1996 | Dorri et al. | 335/216 |
| 6,150,911 | A * | 11/2000 | Katznelson et al. | 335/299 |
| 6,289,681 | B1 * | 9/2001 | Eckels et al. | 62/47.1 |
| 6,411,187 | B1 | 6/2002 | Rotem et al. | |
| 6,570,476 | B1 * | 5/2003 | Laskaris | 335/216 |
| 6,650,214 | B2 * | 11/2003 | Aoki et al. | 335/299 |
| 6,861,933 | B1 * | 3/2005 | Yoshida et al. | 335/301 |
| 7,242,191 | B2 * | 7/2007 | Laskaris et al. | 324/318 |
| 7,382,134 | B2 * | 6/2008 | Matsumoto | 324/319 |
| 7,665,312 | B2 * | 2/2010 | Jonas et al. | 62/51.1 |
| 8,106,736 | B2 * | 1/2012 | Calvert | 335/299 |
| 8,970,337 | B2 * | 3/2015 | Dunckley et al. | 336/208 |
| 2011/0304416 | A1 * | 12/2011 | Warner et al. | 335/216 |
| 2014/0097920 | A1 * | 4/2014 | Goldie et al. | 335/216 |

FOREIGN PATENT DOCUMENTS

| | | |
|---|---|---|
| JP | 2005-204683 A | 8/2003 |
| JP | 2004-350779 A | 12/2004 |
| JP | 2005-185319 A | 7/2005 |

OTHER PUBLICATIONS

European Supplementary Search Report dated Apr. 1, 2015 issued in the corresponding European Patent Application No. 12874613.8 (8 pages).

* cited by examiner

SUPERCONDUCTING MAGNET AND METHOD FOR ADJUSTING THE SAME

TECHNICAL FIELD

The present invention relates to a superconducting magnet and a method for adjusting the same, and in particular to a superconducting magnet having a pair of superconducting coils arranged to face each other and a method for adjusting the same.

BACKGROUND ART

When there is a deviation in millimeters in the relative position between a pair of superconducting coils arranged to face each other, such a deviation influences the position of a space in which a static magnetic field is generated, and magnetic homogeneity in the space. Japanese Patent Laying-Open No. 2005-185319 (PTD 1) is a prior art document which discloses a superconducting magnet device capable of adjusting a magnetic field in such a case.

In the superconducting magnet device described in PTD 1, a support member supporting a refrigerant container to a vacuum container is provided with position adjustment means capable of adjusting a supporting dimension from outside the vacuum container with the vacuum container being evacuated. The position adjustment means is used to adjust the position for attaching the refrigerant container from outside the vacuum container during assembly and adjustment to perform magnetic field adjustment in a space in which a static magnetic field is generated.

CITATION LIST

Patent Document

PTD 1: Japanese Patent Laying-Open No. 2005-185319

SUMMARY OF INVENTION

Technical Problem

When the magnetic field adjustment in the space in which the static magnetic field is generated is performed by adjusting the supporting dimension for the refrigerant container within the vacuum container and thereby adjusting the position of a superconducting coil, the range in which the position of the refrigerant container can be adjusted within the vacuum container is not so large, and thus there is room for improvement in terms of expanding the range in which the magnetic field is adjusted. Further, since the position adjustment means is located within the vacuum container, the superconducting magnet device has a complicated structure.

The present invention has been made in view of the aforementioned problems, and one object of the present invention is to provide a superconducting magnet having a wide range in which a magnetic field is adjusted, and having a simple structure.

Solution to Problem

A superconducting magnet in accordance with the present invention includes a pair of superconducting coils, two heat shields surrounding the pair of superconducting coils, respectively, two vacuum chambers accommodating the two heat shields, respectively, and facing each other with a predetermined space sandwiched therebetween, a magnetic shield covering at least a portion of the two vacuum chambers, and two position adjustment mechanisms supporting the two vacuum chambers, respectively, in a position-adjustable manner. The two position adjustment mechanisms change distribution of a static magnetic field formed in the predetermined space by the pair of superconducting coils, by adjusting relative positional relation between the two vacuum chambers.

Advantageous Effects of Invention

According to the present invention, a magnetic field can be adjusted in a wide range with a simple structure.

DESCRIPTION OF EMBODIMENTS

Figure 1:
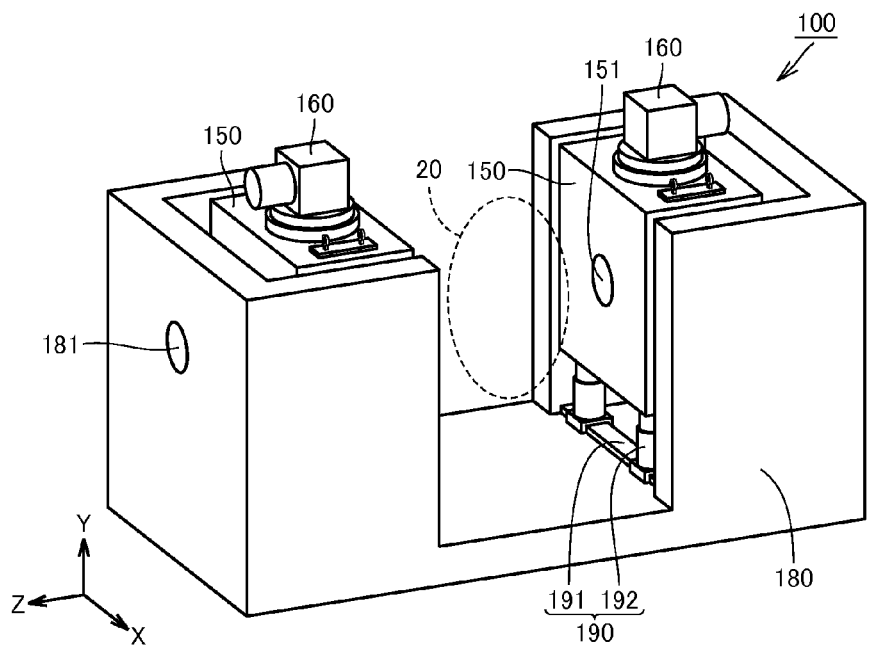
FIG. 1 is a perspective view showing an outer appearance of a superconducting magnet in accordance with Embodiment 1 of the present invention.

Hereinafter, a superconducting magnet and a method for adjusting the same in accordance with Embodiment 1 of the present invention will be described with reference to the drawings. In the description of the embodiments below, identical or corresponding parts in the drawings will be designated by the same reference numerals, and the description thereof will not be repeated.

(Embodiment 1)

Figure 2:
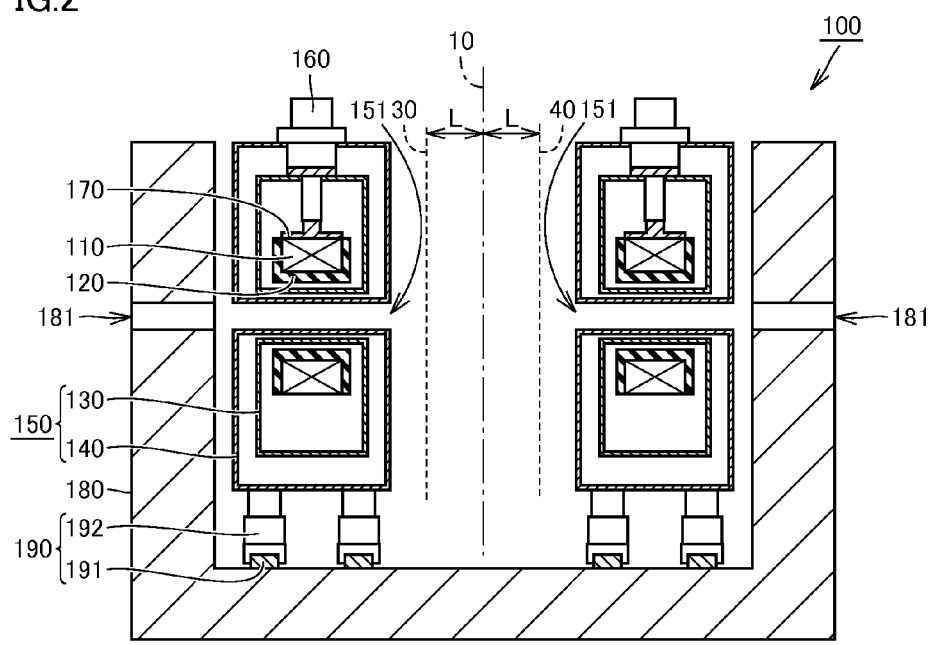
FIG. 2 is a cross sectional view showing a configuration of the superconducting magnet in accordance with Embodiment 1 of the present invention.

FIG. 1 is a perspective view showing an outer appearance of a superconducting magnet in accordance with Embodiment 1 of the present invention. FIG. 2 is a cross sectional view showing a configuration of the superconducting magnet in accordance with Embodiment 1 of the present invention.

As shown in FIGS. 1 and 2, a superconducting magnet 100 in accordance with Embodiment 1 of the present invention includes a pair of superconducting coils 110, two heat shields 130 surrounding the pair of superconducting coils 110, respectively, and two vacuum chambers 140 accommodating two heat shields 130, respectively, and facing each other with a predetermined space 20 sandwiched therebetween. Heat shield 130 and vacuum chamber 140 constitute a cryostat 150.

Superconducting magnet 100 also includes a magnetic shield 180 covering at least a portion of two vacuum chambers 140, and two position adjustment mechanisms 190 supporting two vacuum chambers 140, respectively, in a position-adjustable manner.

Superconducting magnet 100 includes refrigerators 160 each fixed to vacuum chamber 140 for cooling superconducting coil 110 via a heat conductor 170. Superconducting magnet 100 in accordance with the present embodiment is a superconducting magnet employing a so-called conduction cooling method, in which refrigerator 160 and superconducting coil 110 are thermally brought into contact with each other to cool superconducting coil 110.

Hereinafter, the components of superconducting magnet 100 in accordance with the present embodiment will be described. As described above, superconducting magnet 100 in accordance with the present embodiment includes two superconducting coils 110, two heat shields 130, two vacuum chambers 140, and two refrigerators 160.

Superconducting coil 110 is formed of a superconducting wire made of a niobium-titanium alloy, and is wound around a tubular bobbin 120 in a solenoidal shape. The material for the superconducting wire is not limited to a niobium-titanium alloy, and may be, for example, a niobium-tin alloy. Although bobbin 120 is made of stainless steel, the material for bobbin 120 is not limited thereto.

Heat shield 130 prevents heat caused by heat radiation from outside from being transferred into superconducting coil 110. Although heat shield 130 is made of aluminum, the material for heat shield 130 is not limited thereto, and any material having good heat conductivity may be used.

Vacuum chamber 140 accommodates superconducting coil 110, bobbin 120, and heat shield 130. Vacuum chamber 140 insulates the inside of vacuum chamber 140 from the outside thereof by vacuum insulation. Both heat shield 130 and vacuum chamber 140 are structures for preventing heat from being transferred into superconducting coil 110.

Although vacuum chamber 140 has a substantially rectangular parallelepiped outer shape in the present embodiment, the outer shape of vacuum chamber 140 is not limited thereto, and vacuum chamber 140 may have, for example, a substantially columnar outer shape. Two vacuum chambers 140 are arranged such that side surfaces thereof face each other with predetermined space 20 sandwiched therebetween. A shaft hole portion 151 is formed in each of two vacuum chambers 140.

Refrigerator 160 has cooling portions in two stages. The first-stage cooling portion of refrigerator 160 is in contact with heat shield 130. The second-stage cooling portion as a leading end portion of refrigerator 160 is in contact with superconducting coil 110 via heat conductor 170 made of, for example, copper.

Magnetic shield 180 is made of a magnetic body such as iron having a thickness of 100 mm or more to effectively reduce a magnetic field leaking from superconducting magnet 100 to the outside. Magnetic shield 180 covers side surfaces other than the facing surfaces and bottom surfaces of two vacuum chambers 140.

In the present embodiment, magnetic shield 180 has position references for adjustment of positions of two vacuum chambers 140 by two position adjustment mechanisms 190. Specifically, two through holes 181 serving as the position references are provided in side portions opposite to each other of magnetic shield 180. Central axes of two through holes 181 substantially match central axes of shaft hole portions 151 in two vacuum chambers 140.

Each of two position adjustment mechanisms 190 includes a linear guide 191 provided on magnetic shield 180, and two jacks 192 provided on linear guide 191. Linear guide 191 includes a rail fixed on magnetic shield 180, and two movable blocks sliding on the rail.

Each jack 192 is fixed on the movable block of linear guide 191. Jack 192 may be any of a mechanical jack such as a screw jack, a liquid operated jack such as a hydraulic jack, and an air operated jack such as an air jack.

Cryostat 150 is supported by position adjustment mechanism 190. The position of cryostat 150 in the X direction in FIG. 1 is adjusted by linear guide 191. The position of cryostat 150 in the Y direction in FIG. 1 is adjusted by jacks 192.

Hereinafter, an operation when a magnetic field is generated in superconducting magnet 100 will be described.

First, pressure within each vacuum chamber 140 is reduced to evacuate vacuum chamber 140 in order to make superconducting coil 110 superconductive. Thereafter, refrigerator 160 is actuated. Heat shield 130 is cooled to about 60K by the first-stage cooling portion of refrigerator 160. Superconducting coil 110 is eventually cooled to a temperature of 4K or less by the second-stage cooling portion of refrigerator 160.

After heat shield 130 and superconducting coil 110 are fully cooled, a magnetic field is generated by passing a current from an external power supply device not shown to superconducting coil 110 through a lead. In the present embodiment, predetermined space 20 between the facing surfaces of two vacuum chambers 140 is a region in which a generated static magnetic field is utilized.

Distribution of the static magnetic field generated in predetermined space 20 is determined by the arrangement of superconducting coils 110 and magnetic shield 180. One superconducting coil 110 generates a magnetic field which is line symmetric with respect to the axis of superconducting coil 110. A magnetic field generated by two superconducting coils 110 is provided as an overlap of the magnetic fields generated by respective superconducting coils 110. In addition, by magnetization of magnetic shield 180, a magnetic field generated by magnetic shield 180 is overlapped with the magnetic field generated by two superconducting coils 110.

Figure 3:
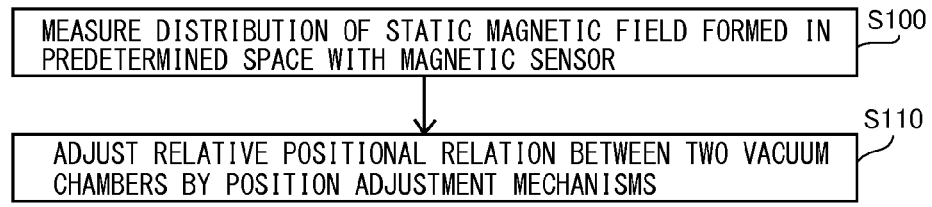
FIG. 3 is a flowchart showing a method for adjusting the superconducting magnet in accordance with the present embodiment.

In order to make the distribution of the static magnetic field formed by overlapping the magnetic fields as described above a desired distribution, the following steps are performed in a method for adjusting the superconducting magnet in accordance with the present embodiment. FIG. 3 is a flowchart showing a method for adjusting the superconducting magnet in accordance with the present embodiment.

First, positions of cryostats 150 within magnetic shield 180 are adjusted such that the central axes of through holes 181 in magnetic shield 180 match the central axes of shaft hole portions 151 in vacuum chambers 140. On this occasion, the central axes of shaft hole portions 151 in vacuum chambers 140 facing each other are adjusted to match with each other.

For example, the central axes of through holes 181 and shaft hole portions 151 are matched with each other by inserting one rod member into two through holes 181 in magnetic shield 180 and shaft hole portions 151 in two vacuum chambers 140, the rod member having a diameter slightly smaller than internal diameters of through holes 181 and internal diameters of shaft hole portions 151. With the positions being adjusted in such a state, linear guide 191 and jacks 192 are fixed by stoppers not shown.

Next, as shown in FIG. 3, the pair of superconducting coils 110 is excited, and distribution of a static magnetic field formed in predetermined space 20 by the pair of superconducting coils 110 is measured with a magnetic sensor (S100). As the magnetic sensor, a sensor such as a gauss meter or a tesla meter can be used.

In the present embodiment, first, the distribution of the static magnetic field is measured on a first measurement plane 30 located away from an intermediate plane 10 located at an intermediate position between the side surfaces facing each other of two vacuum chambers 140, toward vacuum chamber 140 located on the left side in FIG. 2, by a predetermined distance L, to be in parallel thereto.

Next, the distribution of the static magnetic field is measured on a second measurement plane 40 located away from intermediate plane 10 toward vacuum chamber 140 located on the right side in FIG. 2, by predetermined distance L, to be in parallel thereto, Distance L is, for example, 150 mm.

Figure 4:
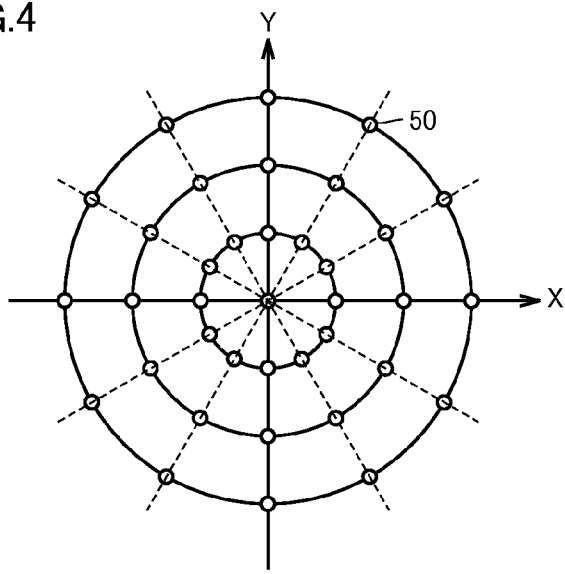
FIG. 4 is a view showing measurement points on one measurement plane.

FIG. 4 is a view showing measurement points on one measurement plane. As shown in FIG. 4, in the present embodiment, 37 measurement points 50 are set on each of first measurement plane 30 and second measurement plane 40.

The intersection of the X axis and the Y axis in FIG. 4 is the intersection of first measurement plane 30 or second measurement plane 40 and the central axis of shaft hole portion 151 in vacuum chamber 140. Measurement points 50 are radially arranged on three circles having different radii centered at the intersection.

Distribution of a static magnetic field formed by each of the pair of superconducting coils 110 can be grasped from a result of measurement with the magnetic sensor at 37 measurement points 50 on each of first measurement plane 30 and second measurement plane 40.

The result of measurement on first measurement plane 30 is significantly influenced by the static magnetic field formed by superconducting coil 110 located on the left side in FIG. 2 which is close to first measurement plane 30. On the other hand, the result of measurement on second measurement plane 40 is significantly influenced by the static magnetic field formed by superconducting coil 110 located on the right side in FIG. 2 which is close to second measurement plane 4.

Accordingly, the distribution of the static magnetic field formed by each of the pair of superconducting coils 110 can be grasped by comparing the result of measurement on first measurement plane 30 with the result of measurement on second measurement plane 40.

Figure 5:
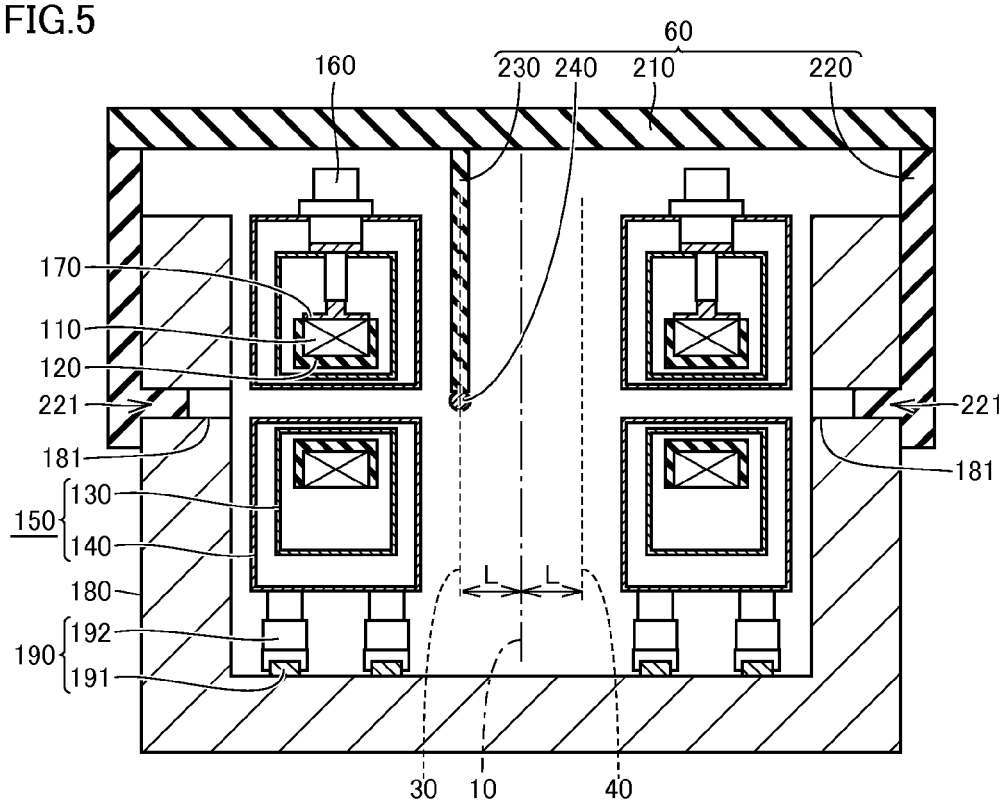
FIG. 5 is a cross sectional view showing a state in which a magnetic sensor device is attached to the superconducting magnet in the present embodiment.

It is noted that, in the present embodiment, measurement is performed by attaching a jig for the magnetic sensor to two through holes 181 in magnetic shield 180. FIG. 5 is a cross sectional view showing a state in which a magnetic sensor device is attached to the superconducting magnet in the present embodiment.

As shown in FIG. 5, a magnetic sensor device 60 includes a jig formed of a shaft portion 210, a pair of leg portions 220 extending downward from both ends of shaft portion 210, and a support portion 230 extending downward from a lower surface of shaft portion 210 for supporting a magnetic sensor 240. A pair of protruding portions 221 is provided on side surfaces facing each other of the pair of leg portions 220, at lower ends thereof. Protruding portion 221 has an outer shape formed slightly smaller than the outer shape of through hole 181.

The pair of leg portions 220 are removably attached to shaft portion 210 independently of each other. Support portion 230 is removably attached to shaft portion 210. As support portion 230, a plurality of support portions 230 having lengths different from each other are prepared.

A plurality of attachment portions to which support portion 230 can be attached are formed in shaft portion 210. By attaching one of the plurality of support portions 230 to one of the plurality of attachment portions, magnetic sensor 240 can be arranged one by one at all of 37 measurement points 50 shown in FIG. 4. Further, magnetic sensor 240 can be arranged selectively on first measurement plane 30 or second measurement plane 40.

When magnetic sensor device 60 is attached to superconducting magnet 100, with one of the pair of leg portions 220 being removed from shaft portion 210, protruding portion 221 of the other leg portion 220 is inserted into one through hole 181. Thereafter, with protruding portion 221 of one removed leg portion 220 being inserted into the other through hole 181, one leg portion 220 is attached to shaft portion 210.

Thus, in the step (S100) of measuring the distribution of the static magnetic field, magnetic sensor 240 is arranged within predetermined space 20 by attaching the jig for magnetic sensor 240 to the position references of magnetic shield 180, and thereby magnetic sensor 240 can be arranged with respect to magnetic shield 180 with a high positional accuracy.

Next, the distributions of the static magnetic field on first measurement plane 30 and on second measurement plane 40 measured with magnetic sensor 240 are approximated by a paraboloid. Specifically, the distributions are approximated by a paraboloid expressed by the following equation (1), using the least square method:

$$B(x, y) = h_x(x-x_0)^2 + h_y(y-y_0)^2 + c \qquad (1).$$

By determining parameters $h_x$, $x_0$, $h_y$, $y_0$, and $c$ in equation (1) in each of the distributions of the static magnetic field on first measurement plane 30 and on second measurement plane 40, $(x_0, y_0)$ as a coordinate at which the maximum paraboloid is achieved is determined. The coordinate $(x_0, y_0)$ is the central position of the static magnetic field on each of first measurement plane 30 and second measurement plane 40.

When at least one of the distributions of the static magnetic field on first measurement plane 30 and on second measurement plane 40 is deviated from the desired distribution, relative positional relation between two vacuum chambers 140 is adjusted by two position adjustment mechanisms 190, based on the result of measurement with magnetic sensor 240 in the step (S100) of measuring the distribution of the static magnetic field (S110), as shown in FIG. 3.

For example, when the central position of the static magnetic field is set at (0, 0), superconducting coils 110 are demagnetized, and thereafter cryostat 150 is moved by linear guide 191 in the X direction in FIG. 1 by $-x_0$, and moved by jacks 192 in the Y direction in FIG. 1 by $-y_0$.

Thereafter, superconducting coils 110 are excited again, and distributions of the static magnetic field on first measurement plane 30 and on second measurement plane 40 are measured again. When at least one of the distributions of the static magnetic field on first measurement plane 30 and on second measurement plane 40 is still deviated from the desired distribution in results of measurement thereof, the above positional adjustment is performed again.

Thereafter, measurement of the static magnetic field and positional adjustment are repeated until the distributions of the static magnetic field become the desired distribution.

As described above, superconducting magnet 100 in accordance with the present embodiment can change the distribution of the static magnetic field by adjusting the positions of vacuum chambers 140 by position adjustment mechanisms 190. Therefore, there is no need to arrange position adjustment mechanism 190 within vacuum chamber 140, and a simple structure can be implemented. Thus, magnetic field adjustment can be performed in a wide range in which vacuum chamber 140 is movable within magnetic shield 180.

In addition, by using the position references provided in magnetic shield 180 to arrange an apparatus utilizing the static magnetic field in predetermined space 20, the apparatus can utilize the static magnetic field having the desired distribution.

Hereinafter, a superconducting magnet and a method for adjusting the same in accordance with Embodiment 2 of the present invention will be described. It is noted that, since a superconducting magnet 200 in accordance with the present embodiment is different from superconducting magnet 100 in accordance with Embodiment 1 only in the configuration of the position adjustment mechanism and the shapes of the magnetic shield and the vacuum chamber, the description of other components will not be repeated.

(Embodiment 2)

Figure 6:
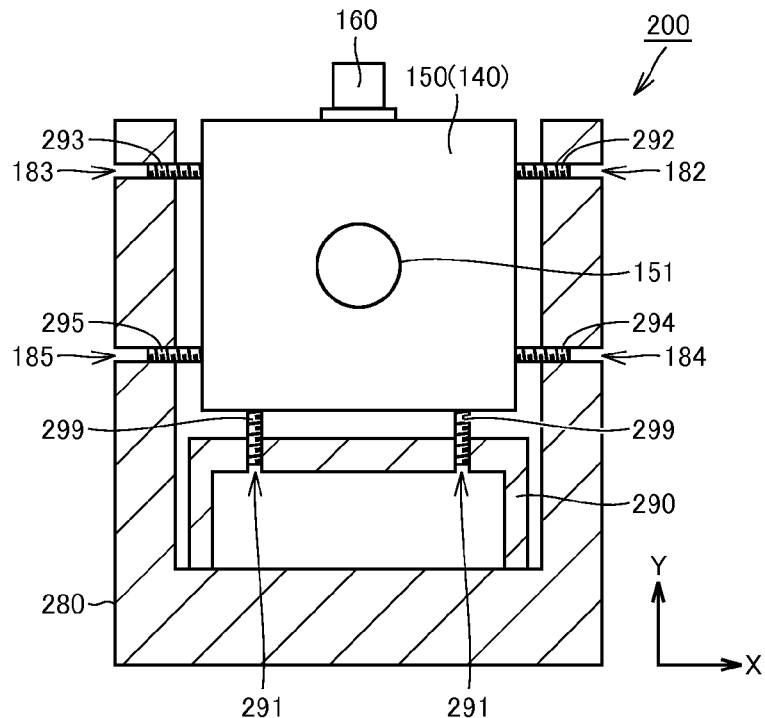
FIG. 6 is a partial cross sectional view showing a configuration of a superconducting magnet in accordance with Embodiment 2 of the present invention.

FIG. 6 is a partial cross sectional view showing a configuration of a superconducting magnet in accordance with Embodiment 2 of the present invention. In FIG. 6, only the magnetic shield is shown as viewed in cross section.

As shown in FIG. 6, in superconducting magnet 200 in accordance with Embodiment 2 of the present invention, a support table 290 for supporting vacuum chamber 140 is placed on a magnetic shield 280. Support table 290 is made of a magnetic body such as iron, and has a function of a magnetic shield.

The position adjustment mechanism of superconducting magnet 200 in accordance with the present embodiment includes internal threads provided to penetrate through magnetic shield 280 and support table 290, and set screws screwed into the internal threads.

Specifically, the position adjustment mechanism is composed of an internal thread 182 and a set screw 292 provided at one side portion of an upper part of magnetic shield 280, an internal thread 183 and a set screw 293 provided at the other side portion of the upper part of magnetic shield 280, an internal thread 184 and a set screw 294 provided at one side portion of a lower part of magnetic shield 280, an internal thread 185 and a set screw 295 provided at the other side portion of the lower part of magnetic shield 280, and internal threads 291 and set screws 299 provided at an upper surface of support table 290.

Vacuum chamber 140 is supported in a positioned state by being pressed from the circumference thereof by the set screws described above. It is noted that, in the present embodiment, a hexagon socket set screw is used as the set screw. Further, the set screw is made of a non-magnetic body such as SUS304 to be easily handled in the magnetic field.

In the present embodiment, the position of vacuum chamber 140 can be changed by adjusting the amount of tightening each set screw. For example, when vacuum chamber 140 is moved in the upper left direction in FIG. 6, the amounts of tightening set screws 291, 292, and 294 are increased, and the amounts of tightening set screws 293 and 295 are decreased.

By adjusting relative positional relation between two vacuum chambers 140 as described above, distribution of a static magnetic field formed in predetermined space 20 can be changed. The procedure of a method for adjusting superconducting magnet 200 in accordance with the present embodiment is the same as that of the method for adjusting superconducting magnet 100 in accordance with Embodiment 1.

Also in the present embodiment, there is no need to arrange the position adjustment mechanism within vacuum chamber 140, and a simple structure can be implemented. Thus, magnetic field adjustment can be performed in a wide range in which vacuum chamber 140 is movable within magnetic shield 280.

Hereinafter, a superconducting magnet and a method for adjusting the same in accordance with Embodiment 3 of the present invention will be described. It is noted that, since a superconducting magnet 300 in accordance with the present embodiment is different from superconducting magnet 200 in accordance with Embodiment 2 only in the shape of the magnetic shield and the attitude of the refrigerator, the description of other components will not be repeated.

(Embodiment 3)

Figure 7:
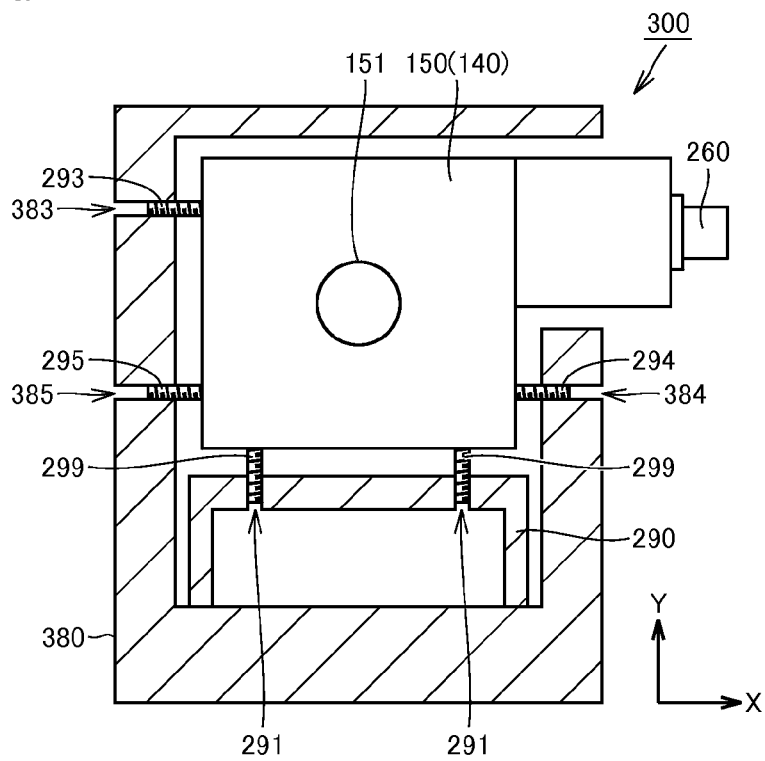
FIG. 7 is a partial cross sectional view showing a configuration of a superconducting magnet in accordance with Embodiment 3 of the present invention.

FIG. 7 is a partial cross sectional view showing a configuration of a superconducting magnet in accordance with Embodiment 3 of the present invention. In FIG. 7, only the magnetic shield is shown as viewed in cross section.

As shown in FIG. 7, in superconducting magnet 300 in accordance with the present embodiment, a refrigerator 260 is attached laterally. Accordingly, a magnetic shield 380 has a short side portion on the side where refrigerator 260 is located, and has a tall side portion on the opposite side. Further, magnetic shield 380 also covers a portion above vacuum chamber 140.

The position adjustment mechanism of superconducting magnet 300 in accordance with the present embodiment includes internal threads provided to penetrate through magnetic shield 380 and a support table 290, and set screws screwed into the internal threads.

Specifically, the position adjustment mechanism is composed of an internal thread 383 and set screw 293 provided at the other side portion of an upper part of magnetic shield 380, an internal thread 384 and set screw 294 provided at one side portion of a lower part of magnetic shield 380, an internal thread 385 and set screw 295 provided at the other side portion of the lower part of magnetic shield 380, and internal threads 291 and set screws 299 provided at the upper surface of support table 290.

Since magnetic shield 380 has a shape which is asymmetric in the X direction in FIG. 7, a magnetic field generated by magnetization of magnetic shield 380 is also asymmetric in the X direction.

In addition, an attractive force generated between superconducting coils 110 and magnetic shield 380 is also asymmetric in the X direction. Accordingly, cryostat 150 receives an attractive force in the −X direction toward the left side in FIG. 7 where a larger portion of the magnetic body exists.

Therefore, in a method for adjusting superconducting magnet 300 in accordance with the present embodiment, superconducting coils 110 are excited, with the central position of cryostat 150 being moved in the +X direction with respect to the central position of magnetic shield 380 and fixed beforehand. The distance moved in the +X direction is, for example, about 5 mm.

Next, distribution of a static magnetic field formed in predetermined space 20 is measured with magnetic sensor 240 (S100), as in the method for adjusting superconducting magnet 100 in accordance with Embodiment 1. A result of measurement thereof is approximated by the paraboloid expressed by the above equation (1). The central position of the static magnetic field obtained from the approximated paraboloid is moved in the +X direction.

Next, relative positional relation between two vacuum chambers 140 is adjusted by the position adjustment mechanisms (S110). Specifically, with superconducting coils 110 being excited, the amounts of tightening set screws 293 and 295 are decreased based on the result of measurement of the distribution of the static magnetic field. Then, vacuum chamber 140 is moved to the left side in FIG. 7 by the attractive force in the −X direction. Thereafter, the amount of tightening set screw 294 is increased to position vacuum chamber 140.

In that state, distribution of the static magnetic field is measured again. When the distribution of the static magnetic field is still deviated from the desired distribution in a result of measurement thereof, the above positional adjustment is performed again. Thereafter, measurement of the static magnetic field and positional adjustment are repeated until the distribution of the static magnetic field becomes the desired distribution.

As described above, in superconducting magnet 300 in accordance with the present embodiment, the distribution of the static magnetic field can be changed without demagnetizing superconducting coils 110. Therefore, adjustment of superconducting magnet 300 can be performed in a short time.

Also in the present embodiment, there is no need to arrange the position adjustment mechanism within vacuum chamber 140, and a simple structure can be implemented. Thus, magnetic field adjustment can be performed in a wide range in which vacuum chamber 140 is movable within magnetic shield 380.

Hereinafter, a superconducting magnet and a method for adjusting the same in accordance with Embodiment 4 of the present invention will be described. It is noted that, since a superconducting magnet 400 in accordance with the present embodiment is different from superconducting magnet 100 in accordance with Embodiment 1 only in the method of cooling the superconducting coils, the description of other components will not be repeated.

(Embodiment 4)

Figure 8:
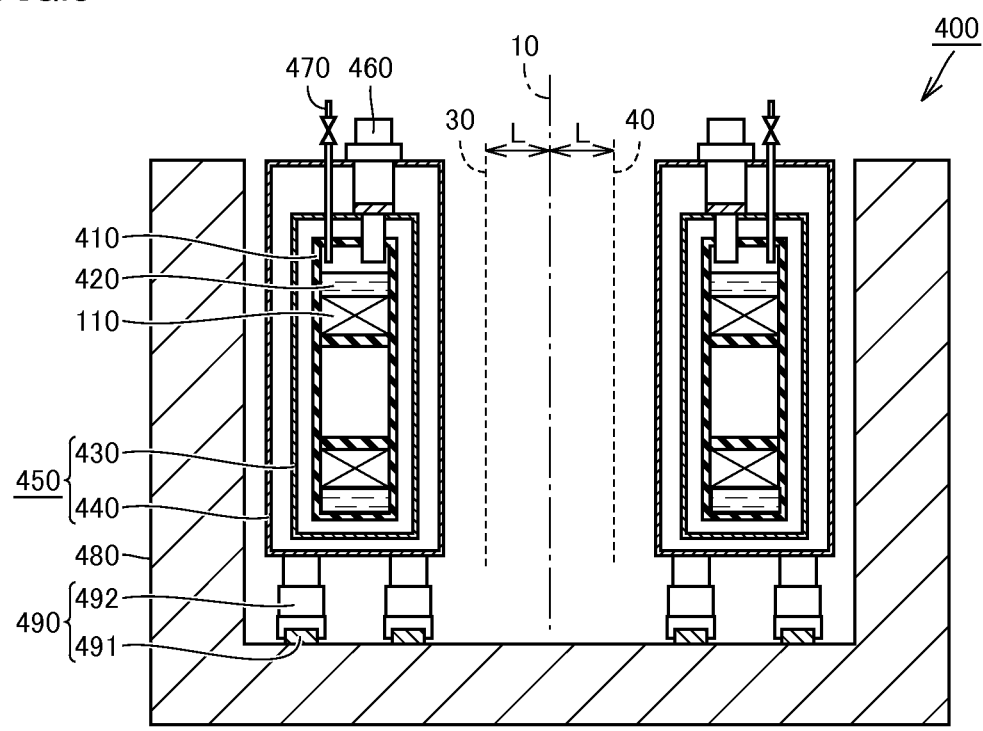
FIG. 8 is a cross sectional view showing a configuration of a superconducting magnet in accordance with Embodiment 4 of the present invention.

FIG. 8 is a cross sectional view showing a configuration of a superconducting magnet in accordance with Embodiment 4 of the present invention. As shown in FIG. 8, superconducting magnet 400 in accordance with Embodiment 4 of the present invention includes superconducting coils 110, helium chambers 410 each accommodating superconducting coil 110 and storing liquid helium 420 therein, heat shields 430 each surrounding helium chamber 410, and vacuum chambers 440 each accommodating heat shield 430. Heat shield 430 and vacuum chamber 440 constitute a cryostat 450.

Superconducting magnet 400 also includes a magnetic shield 480 covering at least a portion of vacuum chambers 440, and refrigerators 460 each fixed to vacuum chamber 440 for cooling superconducting coil 110 by liquefying vaporized liquid helium 420.

Superconducting magnet 400 further includes two position adjustment mechanisms 490 supporting two vacuum chambers 440, respectively, in a position-adjustable manner.

Superconducting magnet 400 in accordance with the present embodiment is a superconducting magnet employing a so-called helium cooling method, in which superconducting coil 110 is cooled by being immersed in liquid helium 420.

Hereinafter, the components of superconducting magnet 400 in accordance with the present embodiment will be described. Superconducting magnet 400 in accordance with the present embodiment includes two superconducting coils 110, two helium chambers 410, two heat shields 430, two vacuum chambers 440, and two refrigerators 460.

Helium chamber 410 has an O-shaped outer shape. Superconducting coil 110 is wound around a shaft portion of helium chamber 410. A helium tube 470 is coupled to an upper part of helium chamber 410. Helium tube 470 is provided to pour liquid helium 420 and to emit helium gas, which is vaporized liquid helium 420. Superconducting coil 110 is cooled by liquid helium 420 stored inside helium chamber 410.

A first-stage cooling portion of refrigerator 460 is in contact with heat shield 430. A second-stage cooling portion as a leading end portion of refrigerator 460 is in contact with the vaporized liquid helium inside helium chamber 410 to cool and reliquefy the vaporized liquid helium.

Each of two position adjustment mechanisms 490 includes a linear guide 491 provided on magnetic shield 480, and two jacks 492 provided on linear guide 491. Linear guide 491 includes a rail fixed on magnetic shield 480, and two movable blocks sliding on the rail.

Each jack 492 is fixed on the movable block of linear guide 491. Jack 492 may be any of a mechanical jack such as a screw jack, a liquid operated jack such as a hydraulic jack, and an air operated jack such as an air jack.

Cryostat 450 is supported by position adjustment mechanism 490. The position of cryostat 450 in the X direction in FIG. 8 is adjusted by linear guide 491. The position of cryostat 450 in the Y direction in FIG. 8 is adjusted by jacks 492.

It is noted that, although superconducting magnet 400 in accordance with the present embodiment has position adjustment mechanism 490 including linear guide 491 and jacks 492, the position adjustment mechanism is not limited thereto, and superconducting magnet 400 may have the position adjustment mechanism including internal threads and set screws in accordance with Embodiments 2, 3.

Also in the present embodiment, there is no need to arrange the position adjustment mechanism within vacuum chamber 440, and a simple structure can be implemented. Thus, magnetic field adjustment can be performed in a wide range in which vacuum chamber 440 is movable within magnetic shield 480.

It is noted that the embodiments disclosed herein are illustrative in every respect, and do not serve as a basis for restrictive interpretation. Therefore, the technical scope of the present invention should not be interpreted by the above embodiments only, and is defined based on the description in the scope of the claims. Further, any modifications within the scope and meaning equivalent to the scope of the claims are included.

Reference Signs List

10: intermediate plane; 20: space; 30: first measurement plane; 40: second measurement plane; 50: measurement point; 60: magnetic sensor device; 100, 200, 300, 400: superconducting magnet; 110: superconducting coil; 120: bobbin; 130, 430: heat shield; 140, 440: vacuum chamber; 150, 450: cryostat; 151: shaft hole portion; 160, 260, 460: refrigerator; 170: heat conductor; 180, 280, 380, 480: magnetic shield; 181: through hole; 182, 183, 184, 185, 291, 383, 384, 385: internal thread; 190, 490: position adjustment mechanism; 191, 491: linear guide; 192, 492: jack; 210: shaft portion; 220: leg portion; 221: protruding portion; 230: support portion; 240: magnetic sensor; 290, 390: support table; 291, 292, 293, 294, 295, 299: set screw; 410: helium chamber; 420: liquid helium; 470: helium tube.

The invention claimed is:

1. A superconducting magnet, comprising:
   a pair of superconducting coils;
   two heat shields surrounding said pair of superconducting coils, respectively;
   two vacuum chambers accommodating said two heat shields, respectively, and facing each other with a predetermined space sandwiched therebetween;
   a magnetic shield covering at least a portion of said two vacuum chambers; and
   two position adjustment mechanisms supporting said two vacuum chambers, respectively, in a position-adjustable manner,
   said two position adjustment mechanisms changing distribution of a static magnetic field formed in said predetermined space by said pair of superconducting coils, by adjusting relative positional relation between said two vacuum chambers, said magnetic shield having two through holes as position references for adjustment of positions of said two vacuum chambers by said two position adjustment mechanisms.

2. The superconducting magnet according to claim 1, wherein each of said two position adjustment mechanisms includes a linear guide provided on said magnetic shield, and a jack provided on the linear guide.

3. The superconducting magnet according to claim 1, wherein each of said two position adjustment mechanisms includes an internal thread provided to penetrate through said magnetic shield, and a set screw screwed into the internal thread.

4. A method for adjusting a superconducting magnet, the superconducting magnet including a pair of superconducting coils, two heat shields surrounding said pair of superconducting coils, respectively, two vacuum chambers accommodating said two heat shields, respectively, and facing each other with a predetermined space sandwiched therebetween, a magnetic shield covering at least a portion of said two vacuum chambers, and two position adjustment mechanisms supporting said two vacuum chambers, respectively, in a position-adjustable manner, the method comprising the steps of:

measuring distribution of a static magnetic field formed in said predetermined space by said pair of superconducting coils, with a magnetic sensor; and adjusting relative positional relation between said two vacuum chambers by said two position adjustment mechanisms, based on a result of measurement with said magnetic sensor in the step of measuring the distribution of said static magnetic field, in the step of measuring the distribution of said static magnetic field, said magnetic sensor being arranged within said predetermined space by attaching a jig for said magnetic sensor to a through hole in said magnetic shield, said through hole being a position reference as a basis for adjusting the relative positional relation between said two vacuum chambers.

5. The method for adjusting the superconducting magnet according to claim 4, wherein, in the step of adjusting the relative positional relation between said two vacuum chambers, the relative positional relation between said two vacuum chambers is adjusted using a linear guide provided on said magnetic shield and a jack provided on the linear guide which are included in each of said two position adjustment mechanisms.

6. The method for adjusting the superconducting magnet according to claim 4, wherein, in the step of adjusting the relative positional relation between said two vacuum chambers, the relative positional relation between said two vacuum chambers is adjusted using an internal thread provided to penetrate through said magnetic shield and a set screw screwed into the internal thread which are included in each of said two position adjustment mechanisms.

7. The superconducting magnet according to claim 1, wherein each of the two vacuum chambers includes a shaft hole portion, and the two vacuum chambers are adjustable by the position adjustment mechanism so that a central axis of the shaft hole portion matches with a central axis of the two through holes in the magnetic shield.

8. The method for adjusting the superconducting magnet according to claim 4, wherein at least one of the two vacuum chambers includes a shaft hole portion, and the method includes adjusting the at least one vacuum chamber so that a central axis of the shaft hole portion matches with a central axis of the through hole in the magnetic shield.

* * * * *